(12) United States Patent
Rajzer et al.

(10) Patent No.: US 11,929,698 B2
(45) Date of Patent: Mar. 12, 2024

(54) SHORT CIRCUIT PROTECTION FOR A BLDC MOTOR (71) Applicant: Snap-on Incorporated, Kenosha, WI (US)

(72) Inventors: Michael T. Rajzer, Kenosha, WI (US); Jason Genz, Kenosha, WI (US)

(73) Assignee: Snap-on Incorporated, Kenosha, WI (US)

( * ) Notice: Subject to any disclaimer, the term of this patent is extended or adjusted under 35 U.S.C. 154(b) by 0 days.

(21) Appl. No.: 17/694,249

(22) Filed: Mar. 14, 2022

(65) Prior Publication Data

US 2022/0311372 A1 Sep. 29, 2022

Related U.S. Application Data (60) Provisional application No. 63/164,696, filed on Mar. 23, 2021.

(51) Int. Cl.
*G01R 31/34* (2020.01)
*B25B 21/00* (2006.01)
(Continued)

(52) U.S. Cl.
CPC .......... *H02P 29/024* (2013.01); *B25B 21/004* (2013.01); *G01R 31/343* (2013.01); *H02K 7/145* (2013.01)

(58) Field of Classification Search
CPC ...... H02P 29/024; H02P 6/085; B25B 21/004; B25B 21/00; G01R 31/343;
(Continued)

(56) References Cited

U.S. PATENT DOCUMENTS

| 5,371,712 A | 12/1994 | Oguchi et al. |
| 5,654,859 A * | 8/1997 | Shi .......................... H02J 9/00 361/100 |

(Continued)

FOREIGN PATENT DOCUMENTS

| CN | 104333274 A | 2/2015 |
| CN | 104656000 B | 5/2015 |

(Continued)

OTHER PUBLICATIONS

Combined Search and Examination Report for corresponding Application No. GB2203887.1 dated Sep. 9, 2022, 8 pages.
(Continued)

*Primary Examiner* — Tung X Nguyen
*Assistant Examiner* — Robert P Alejnikov, Jr.
(74) *Attorney, Agent, or Firm* — Seyfarth Shaw LLP (57) ABSTRACT The present invention relates to switching element protection of a BLDC motor, such as used with a power tool. The present invention checks each switching element of a power stage individually for a short circuit when a trigger of the tool is actuated. Each switching element is turned ON for a period of time (such as 1-5 microseconds, for example), current flowing through the half-bridge or the full power stage is measured, and that switching element is turned OFF. When the current is greater than or equal to a threshold (such as 5 A, for example), the controller stops and indicates a fault condition. By testing each switching element in order, the controller is able to determine whether the shorted switching element is the opposite one in the half-bridge being tested.

22 Claims, 8 Drawing Sheets (51) Int. Cl.
  *H02K 7/14* (2006.01)
  *H02P 29/024* (2016.01)
(58) Field of Classification Search
  CPC .... G01R 31/3277; G01R 31/52; G01R 31/42;
          H02K 7/145; H02H 7/1225; H02H 11/00;
          B25F 5/00
  USPC .................................................. 324/765.01
  See application file for complete search history.

(56) References Cited

U.S. PATENT DOCUMENTS

| | | | |
|---|---|---|---|
| 8,098,036 B2 * | 1/2012 | Matsunaga | B25F 5/00 318/446 |
| 8,264,190 B2 | 9/2012 | Suzuki | |
| 8,441,230 B2 | 5/2013 | Boyles et al. | |
| 8,489,223 B2 | 7/2013 | Gass | |
| 8,498,732 B2 | 7/2013 | Gass | |
| 9,257,930 B2 * | 2/2016 | Suzuki | H02P 21/0003 |
| 9,350,286 B2 | 5/2016 | Satou et al. | |
| 9,654,048 B2 * | 5/2017 | West | H02P 1/022 |
| 9,658,276 B2 | 5/2017 | Mednik et al. | |
| 9,766,292 B2 * | 9/2017 | Hirose | G01R 31/3278 |
| 2002/0162539 A1 * | 11/2002 | Bolz | G01R 31/006 73/114.63 |
| 2006/0164779 A1 * | 7/2006 | Bengeult | H02H 7/0844 361/100 |
| 2011/0098899 A1 * | 4/2011 | Fuchs | G01R 31/52 361/88 |
| 2012/0161681 A1 * | 6/2012 | Kuroda | H03K 17/18 318/400.21 |
| 2013/0320903 A1 * | 12/2013 | Aalund | H02P 29/0241 318/490 |
| 2015/0010041 A1 | 1/2015 | Koeppl et al. | |
| 2016/0144724 A1 * | 5/2016 | Otte | H02M 7/04 307/10.1 |
| 2017/0350942 A1 * | 12/2017 | Kinsella | G01R 31/52 |
| 2018/0034388 A1 * | 2/2018 | Kawai | H03K 5/1536 |
| 2018/0048141 A1 | 2/2018 | Suzuki | |
| 2018/0102719 A1 * | 4/2018 | Oka | H02P 27/085 |

FOREIGN PATENT DOCUMENTS

| | | | | |
|---|---|---|---|---|
| CN | 111141532 A | * | 5/2020 | .......... G01M 17/007 |
| CN | 111929612 A | | 11/2020 | |
| CN | 112098803 A | * | 12/2020 | |
| DE | 102019104155 A1 | * | 8/2019 | .......... H02M 7/5387 |
| DE | 102019205471 A1 | * | 10/2020 | |
| EP | 2437076 A2 | * | 4/2012 | .......... G01R 31/2608 |
| EP | 3267574 A1 | | 1/2018 | |
| EP | 3731408 A1 | | 10/2020 | |
| GB | 2232830 A | | 12/1990 | |
| JP | 2012213825 A | | 11/2012 | |
| JP | 2015089294 A | | 5/2015 | |
| JP | 2017163714 A | | 9/2017 | |
| JP | 2019193498 A | | 10/2019 | |
| WO | 2009102082 A2 | | 8/2009 | |
| WO | WO-2012167241 A1 | * | 12/2012 | .............. B25C 1/06 |
| WO | WO-2013113051 A2 | * | 8/2013 | ............ B60L 3/0076 |
| WO | WO-2015163415 A1 | * | 10/2015 | ............... B25F 5/00 |
| WO | 2018230142 A1 | | 12/2018 | |

OTHER PUBLICATIONS

Examination Report No. 1 for corresponding Application No. 2022201941 dated Mar. 9, 2023, 5 pages.
Examination Report for corresponding Application No. GB2203887.1 dated Aug. 4, 2023, 5 pages.
Canadian Office Action for corresponding Application No. 3,153,013 dated Sep. 12, 2023, 4 pages.

* cited by examiner

SHORT CIRCUIT PROTECTION FOR A BLDC MOTOR

CROSS REFERENCES TO RELATED APPLICATIONS

This application claims the benefit of U.S. Provisional Patent Application Ser. No. 63/164,696, filed Mar. 23, 2021, the contents of which are incorporated herein by reference in their entirety.

TECHNICAL FIELD OF THE INVENTION

The present invention relates generally to BLDC motors, and more particularly to short circuit protection of a BLDC motor.

BACKGROUND OF THE INVENTION

Power hand tools, such as, for example, motorized ratchet wrenches, impact wrenches, and other drivers, are commonly used in automotive, industrial, and household applications to install and remove threaded fasteners and apply a torque and/or angular displacement to a work piece, such as a threaded fastener, for example. Power hand tools generally include an output member (such as a drive lug or chuck), a trigger switch actuatable by a user, an electric motor contained in a housing, a motor controller, and other components, such as switches, light emitting diodes (LEDs), and batteries, for example.

Power tools with brushless motors generally implement a triple half-bridge power stage that consists of 6 switching elements. However, there can be a risk that one of the two switching elements in each half-bridge fails due to a short circuit. If a short circuit occurs and goes undetected, the entire half-bridge will be short circuited, causing the battery to be short circuited when the other switching element in the half-bridge is turned on. This can result in damage to the motor controller, battery, and end user.

SUMMARY OF THE INVENTION

The present invention relates broadly to short circuit protection of switching elements (such as MOSFETs, for example) for a BLDC motor, such as used in a power tool. The tool includes a tool housing, an output assembly (such as a ratchet head assembly) adapted to provide torque to a work piece, a trigger, a motor housed in the housing, an indicator, a controller, and a power source. The controller may implement and include a triple half-bridge power stage that includes 6 (or any multiple of 6) switching elements (such as MOSFETs).

When the trigger is actuated, prior to commutating the motor, the controller performs a bootstrap capacitor charging process. The controller charges bootstrap capacitors by turning ON the low-side switching elements individually, all at once, all at once with a specific duty cycle (such as 50%, for example), or individually with a specific duty cycle. When this is performed, there is a possibility that one of the high-side switching elements has a short circuit. Thus, the controller turns the low-side switching elements ON for a short period of time (such as 10-100 microseconds, for example) and measures the current flowing through the half-bridge or the full power stage. When the current is greater than or equal to a first threshold (such as 10 A, for example), one of the high-side switching elements has a short circuit, and the controller stops or discontinues the bootstrap capacitor charging process and may indicate a fault condition. When the current is less than the first threshold, the controller continues the bootstrap capacitor charging process by keeping the low-side switching elements ON.

After the switching element short circuit check during the bootstrap capacitor charging process, the controller checks each switching element individually for a short circuit. This is performed by turning each switching element ON for a period of time (such as 1-5 microseconds, for example), measuring the current flowing through the half-bridge or the full power stage, and turning OFF that switching element. When the current is greater than or equal to a second threshold (such as 5 A, for example), the controller stops or discontinues and indicates a fault condition. When the current is less than the second threshold, the controller continues the process and checks each of the switching elements. If no fault is detected, the controller proceeds with normal operation of the BLDC motor.

By testing each switching element individually, the controller is able to determine whether the shorted switching element is the opposite one in the half-bridge being tested. For example, if a high-side switching element is turned ON and the current is greater than or equal to the second threshold (such as 5 A, for example), the low-side switching element in that half-bridge has a short circuit. This two-step switching element short circuit detection may be performed every time the controller powers up (as an initial diagnostics check), and every time the trigger is actuated, so that a short circuit is not introduced or re-introduced into the controller circuit. This reduces the risk of damage to the controller, power source, and other components of the tool due to a short circuit event.

BRIEF DESCRIPTION OF THE DRAWINGS

For the purpose of facilitating an understanding of the subject matter sought to be protected, there is illustrated in the accompanying drawing embodiments thereof, from an inspection of which, when considered in connection with the following description, the subject matter sought to be protected, its construction and operation, and many of its advantages, should be readily understood and appreciated.

DETAILED DESCRIPTION

While this invention is susceptible of embodiments in many different forms, there is shown in the drawings, and will herein be described in detail, a preferred embodiment of the invention with the understanding that the present disclosure is to be considered as an exemplification of the principles of the invention and is not intended to limit the broad aspect of the invention to embodiments illustrated. As used herein, the term "present invention" is not intended to limit the scope of the claimed invention and is instead a term used to discuss exemplary embodiments of the invention for explanatory purposes only.

The present invention relates broadly to short circuit protection of switching elements (such as MOSFETs, for example) of a BLDC used with, for example, a power tool. The tool includes a tool housing, an output assembly (such as a ratchet head assembly) adapted to provide torque to a work piece, a trigger, a motor housed in the housing, an indicator, a controller, and a power source. The controller may implement and include a triple half-bridge power stage that includes 6 (or any multiple of 6) switching elements (such as MOSFETs).

When the trigger is actuated, prior to commutating the motor, the controller performs a bootstrap capacitor charging process. The controller charges bootstrap capacitors by turning ON the low-side switching elements individually, all at once, all at once with a specific duty cycle (such as 50%, for example), or individually with a specific duty cycle. When this is performed, there is a possibility that one of the high-side switching elements has a short circuit. Thus, the controller turns the low-side switching elements ON for a short period of time (such as 10-100 microseconds, for example) and measures the current flowing through the half-bridge or the full power stage. When the current is greater than or equal to a first threshold (such as 10 A, for example), one of the high-side switching elements has a short circuit, and the controller stops or discontinues the bootstrap capacitor charging process and indicates a fault condition. When the current is less than the first threshold, the controller continues the bootstrap capacitor charging process by keeping the low-side switching elements ON.

After the switching element short circuit check during the bootstrap capacitor charging process, the controller checks each switching element individually for a short circuit. This is performed by turning each switching element ON for a period of time (such as 1-5 microseconds for example), measuring the current flowing through the half-bridge or the full power stage, and turning OFF that switching element. When the current is greater than or equal to a second threshold (such as 5 A, for example), the controller stops or discontinues and indicates a fault condition. When the current is less than the second threshold, the controller continues the process and checks each of the switching elements. If no fault is detected, the controller proceeds with normal operation of the BLDC motor.

By testing each switching element individually, the controller is able to determine whether the shorted switching element is the opposite one in the half-bridge being tested. For example, if a high-side switching element is turned ON and the current is greater than or equal to the second threshold (such as 5 A, for example), the low-side switching element in that half-bridge has a short circuit. This two-step switching element short circuit detection may be performed every time the controller powers up (as an initial diagnostics check), and every time the trigger is actuated, so that a short circuit is not introduced or re-introduced into the controller circuit. This reduces the risk of damage to the controller, power source, and other components of the tool due to a short circuit event.

Figure 1:
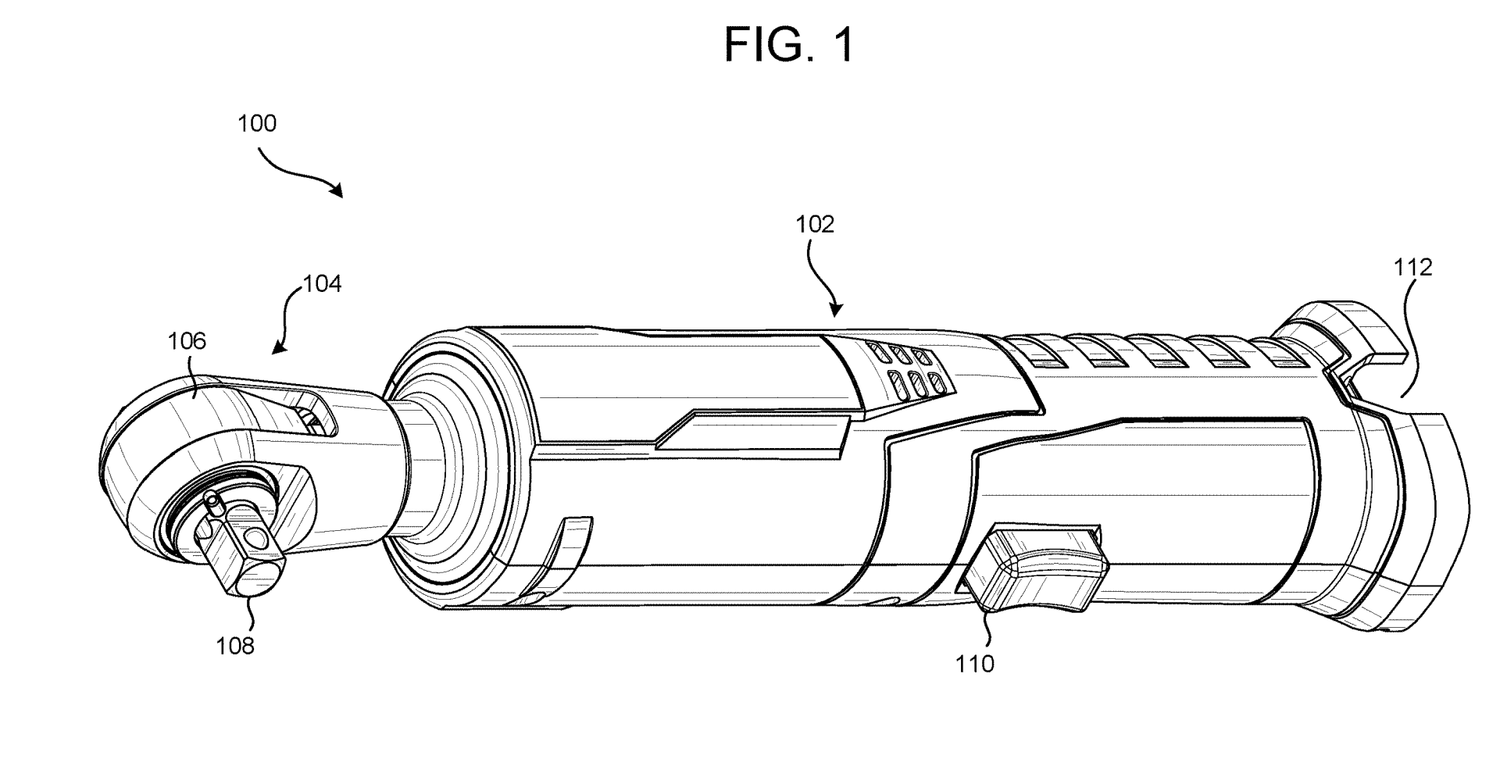
FIG. 1 is perspective view of an exemplar tool incorporating an embodiment of the present invention.
Figure 2:
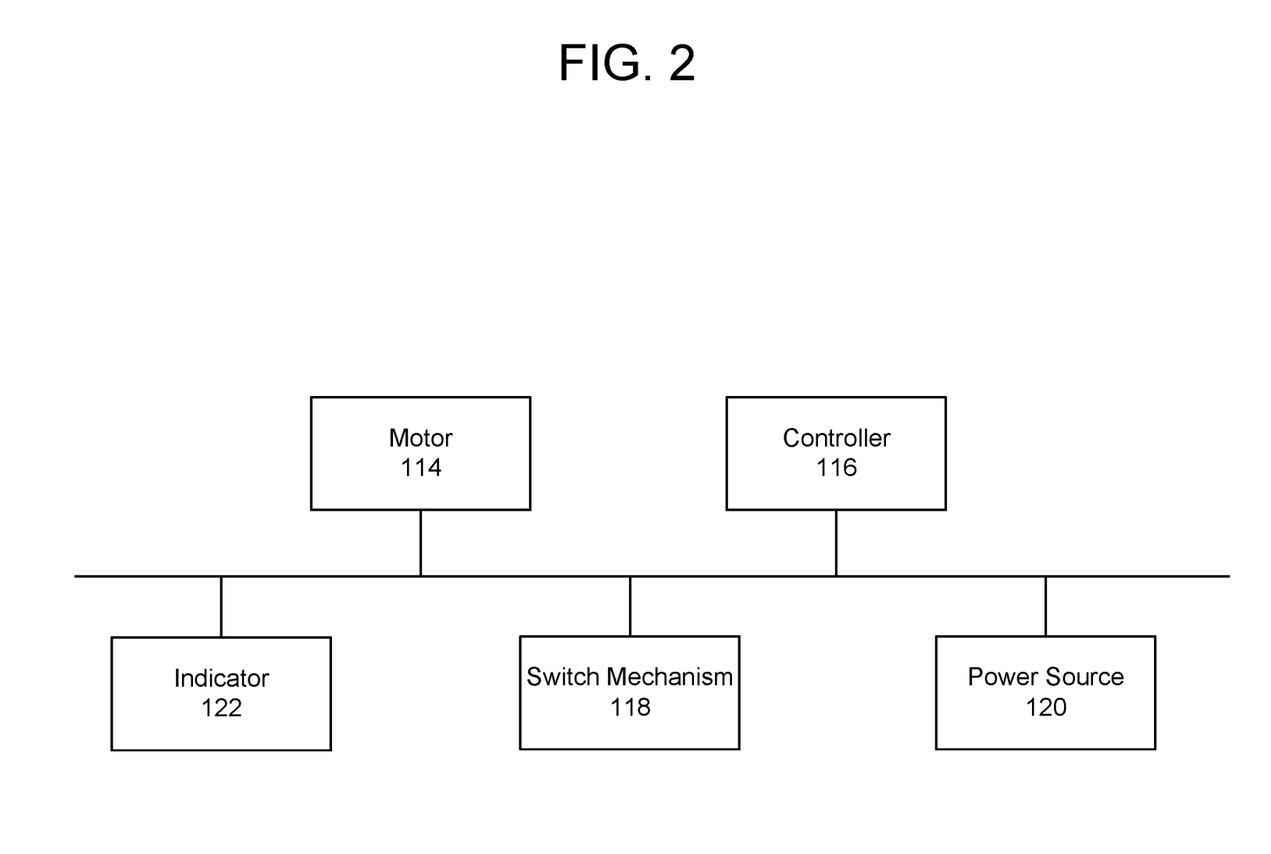
FIGS. 2 and 3 are block component diagrams of electronic components of an exemplar tool incorporating embodiments of the present invention.
Figure 3:
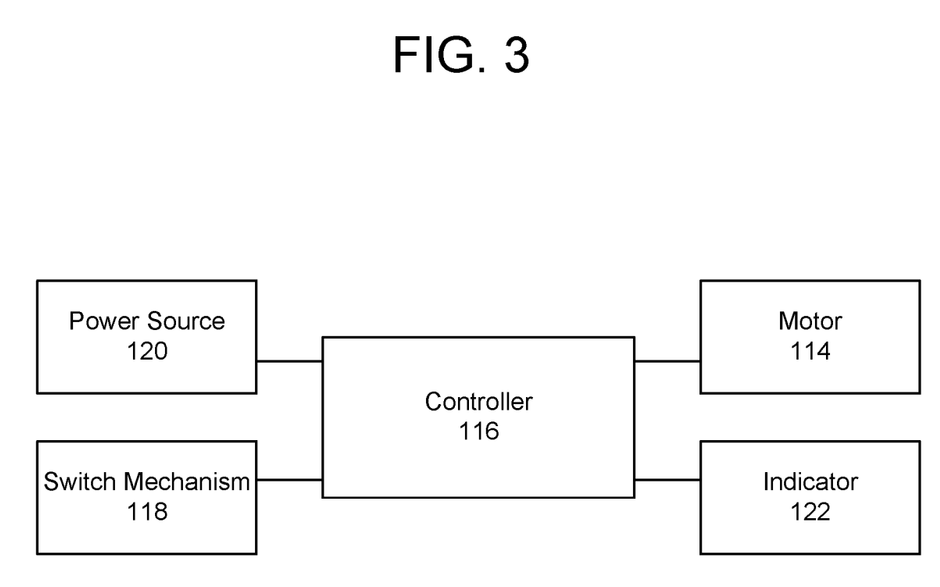

Referring to FIGS. 1-3, an exemplar tool 100 that can be used with the present invention, such as a cordless ratchet-type tool, includes a main tool housing 102 and output assembly 104 (such as a ratchet head assembly). The tool housing 102 may include first and second housing portions that are coupled together in a clamshell type manner and securely coupled to the output assembly 104. The tool housing 102 may enclose or house an electric motor 114 (shown in FIGS. 2 and 3), controller 116 (shown in FIGS. 2 and 3), a switch assembly 118 (shown in FIGS. 2 and 3), display with buttons for configuring and setting the tool, one or more indicators 122 such as light emitting diodes, and other components for operation of the tool, for example. The tool housing 102 may also include a textured or knurled grip to improve a user's grasp of the tool 100 during use.

The output assembly 104 includes a drive portion 106 including a drive lug 108, for example. The drive lug 108 is adapted to apply torque to a work piece, such as a fastener, via an adapter, bit, or socket coupled to the drive lug 108, such as a bi-directional ratcheting square or hexagonal drive. As illustrated, the drive lug 108 is a "male" connector designed to fit into or matingly engage a female counterpart. However, the drive portion 106 may alternatively include a "female" connector designed to matingly engage a male counterpart. The drive portion 106 may also be structured to directly engage a work piece without requiring coupling to an adapter, bit, or socket. The rotational direction of the drive portion 106/drive lug 108 can be selected by rotation of a selector switch to be either a first or second rotational direction (such as, clockwise or counterclockwise).

The tool 100 also includes a trigger 110 that can be actuated by a user to cause the tool 100 to selectively operate. For example, the user can depress the trigger 110 inwardly to selectively cause power to be drawn from a power source 120 and cause a motor 114 to provide torque to the output assembly 104 and cause the drive lug 108 to rotate in a desired rotational direction. The trigger 110 may also be operably coupled to a switch mechanism 118 that is adapted to cause power to be supplied from the power source 120 to the motor 114 when the trigger 110 is actuated. Any suitable trigger 110 or switch can be implemented without departing from the spirit and scope of the present invention. For example, the trigger 110 may also be biased such that the trigger 110 is inwardly depressible, relative to the tool 100, to cause the tool 100 to operate, and a release of the trigger 110 causes the trigger 110 to move outwardly, relative to the tool 100, to cease operation of the tool 100 via the biased nature of the trigger 110. The trigger 110 and switch mechanism 118 may also be a variable speed type mechanism. In this regard, actuation or depression of the trigger 110 causes the motor to operate at a faster speed the further the trigger 110 is depressed.

The motor 114 may be disposed in the tool housing 102 and be adapted to operably engage the output assembly 104, and provide torque to the tool 100, and, in turn, to the drive portion 106/drive lug 108. The motor 114 may be a brushless or brushed type motor, or any other suitable motor. In an example, the motor 114 is a brushless DC motor. A power source 120 can be associated with the tool 100 to provide electronic or other forms of power to the tool 100, such as, for example, electric, hydraulic, or pneumatic, to operate the motor. In an embodiment, the power source 120 can be housed in an end 112 of the tool housing 102, opposite the output assembly 104, a midsection of the tool 100, or any other portion of the tool 100/tool housing 102. The power source 120 may also be an external component that is not housed by the tool 100, but that is operatively coupled to the tool 100 through, for example, wired or wireless means. In an embodiment, the power source 120 is a removable and rechargeable battery that is adapted to be disposed in the end of the tool housing 102 and electrically couple to corresponding terminals of the tool 100.

The controller 116 may be operably coupled to one or more of the power source 120, switch mechanism 118, indicator 122, and the motor 114. The controller 116 may include a central processing unit (CPU) for processing data and computer-readable instructions, and a memory for storing data and instructions. The memory may include volatile random access memory (RAM), non-volatile read only memory (ROM), and/or other types of memory. A data storage component may also be included, for storing data and controller/processor-executable instructions (for example, instructions for the operation and functioning of the tool 100). The data storage component may include one-or-more types of non-volatile solid-state storage, such as flash memory, read-only memory (ROM), magnetoresistive RAM (MRAM), ferroelectric RAM (FRAM), phase-change memory, etc.

Computer instructions for operating the tool 100 and its various components may be executed by the controller 116, using the memory as temporary "working" storage at runtime. The computer instructions may be stored in a non-transitory manner in non-volatile memory, storage, or an external device. Alternatively, some of the executable instructions may be embedded in hardware or firmware in addition to or instead of in software.

Figure 4:
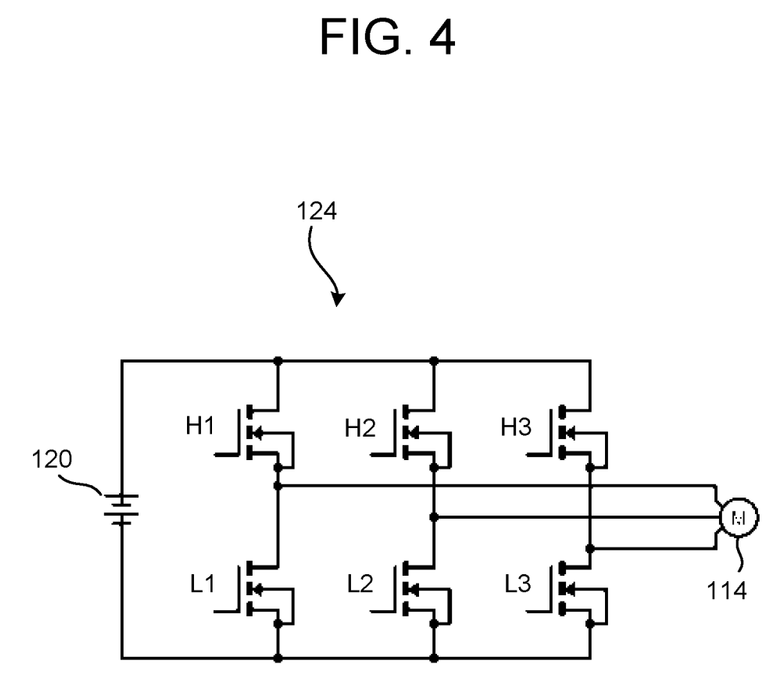
FIG. 4. is an exemplar switching schematic for an exemplar tool having a brushless DC motor incorporating an embodiment of the present invention.

The controller 116 implement and include a power stage, such as a triple half-bridge power stage that includes 6 (or any multiple of 6) switching elements. An example switching schematic is illustrated in FIG. 4. In this example, a power stage with a switching array 124 includes high-side switching elements, $H_1$, $H_2$, and $H_3$, and low-side switching elements, $L_1$, $L_2$, and $L_3$, each having an actuated state (e.g. ON) and a non-actuated state (e.g. OFF). In an embodiment, the switching elements are field-effect transistors (FETs) or metal-oxide-semiconductor field-effect transistors (MOSFETs). The switching array 124 is controlled by the controller 116 to selectively apply power from the power source 120 (e.g., a battery) to the motor 114 to achieve a desired commutation scheme. In other words, the switching elements are actuated between actuated and a non-actuated states in a specific sequence determined by the motor design in order to spin the motor. The speed at which the motor spins may be controlled through open or closed loop control of a pulse width modulation (PWM) duty cycle of the switching elements.

The controller 116 also monitors, analyzes, and processes electric signals from sensors such as, for example, one or more current sensors, one or more speed sensors, one or more Hall Effect sensors, one or more temperature sensors, etc. For example, the speed of the motor 114 can be determined or calculated by the controller using Hall Effect sensors which sense the rotational position of a rotor, in a well-known manner.

The tool 100 and/or controller 116 may also include one or more bootstrap capacitors, and when the trigger 110 is actuated, prior to commutating the motor 114, the controller 116 may perform a bootstrap capacitor charging process. The controller 116 may also implement the methods described herein.

Figure 5:
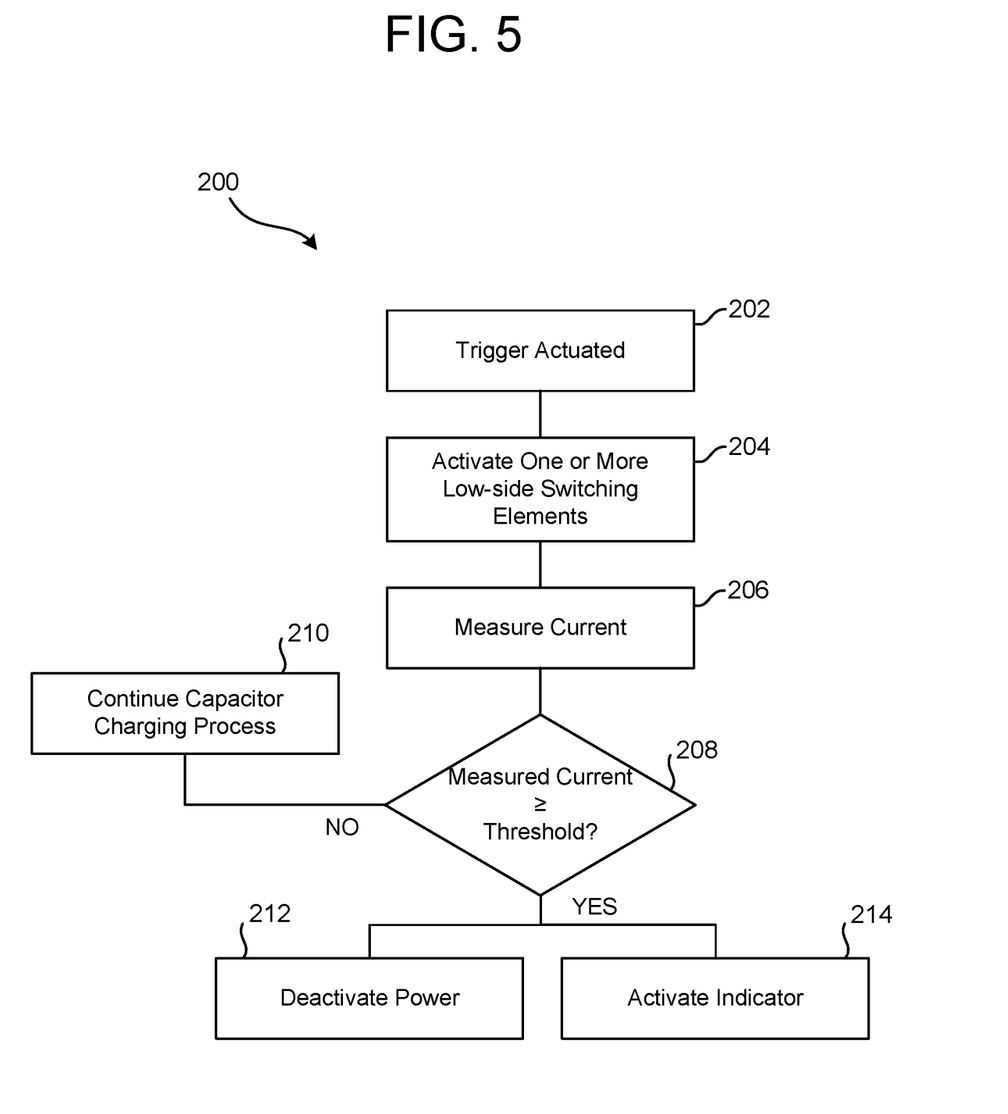
FIG. 5 is a block diagram of a method of short circuit protection of an exemplar tool incorporating an embodiment of the present invention.

For example, when the trigger 110 is actuated, prior to commutating the motor 114, the controller 116 performs a switching element short circuit check during a bootstrap capacitor charging process. Referring to FIG. 5, a method 200 of performing the switching element short circuit check during the bootstrap capacitor charging process is described. The method begins when the trigger 110 is actuated, illustrated as block 202. Once the trigger is actuated, the tool (such as via controller 116) charges bootstrap capacitors by turning ON the low-side switching elements ($L_1$, $L_2$, and $L_3$) individually, all at once, all at once with a specific duty cycle (such as 50%, for example), or individually with a specific duty cycle, illustrated as block 204. When this is performed, there is a possibility that one of the high-side switching elements ($H_1$, $H_2$, and $H_3$) has a short circuit. Thus, the controller 116 turns the low-side switching elements ($L_1$, $L_2$, and $L_3$) ON for a short period of time (such as 10-100 microseconds, for example) and measures the current flowing through the half-bridge or the full power stage, illustrated as block 206.

The controller 116 then determines whether the measured current is greater than or equal to a first threshold (such as 10 A, for example), illustrated as block 208. When the measured current is less than the first threshold, the controller 116 continues the bootstrap capacitor charging process, illustrated as block 210, by keeping the low-side switching elements ($L_1$, $L_2$, and $L_3$) ON. However, when the measured current is greater than or equal to a first threshold, one of the high-side switching elements ($H_1$, $H_2$, and $H_3$) has a short circuit, and the controller 116 deactivates power to the controller 116 and discontinues the bootstrap capacitor charging process, illustrated as block 212, and indicates a fault condition, for example, by activating the indicator 122, illustrated as block 214. The controller 116 may also deactivate the indicator 122 after a predetermined period of time, to conserve power.

Figure 6:
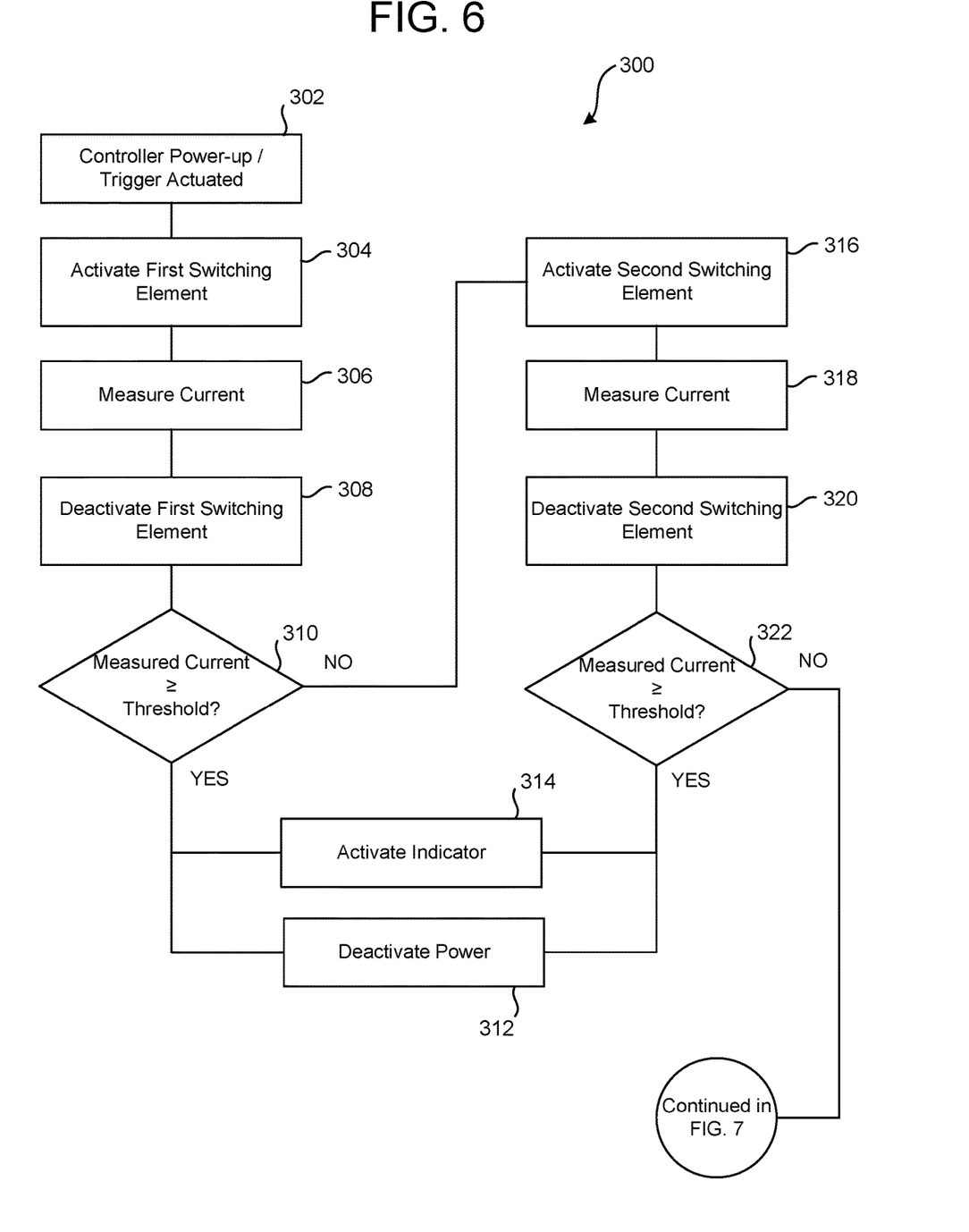
FIGS. 6-8 are block diagrams of another method of short circuit protection of an exemplar tool incorporating an embodiment of the present invention.
Figure 7:
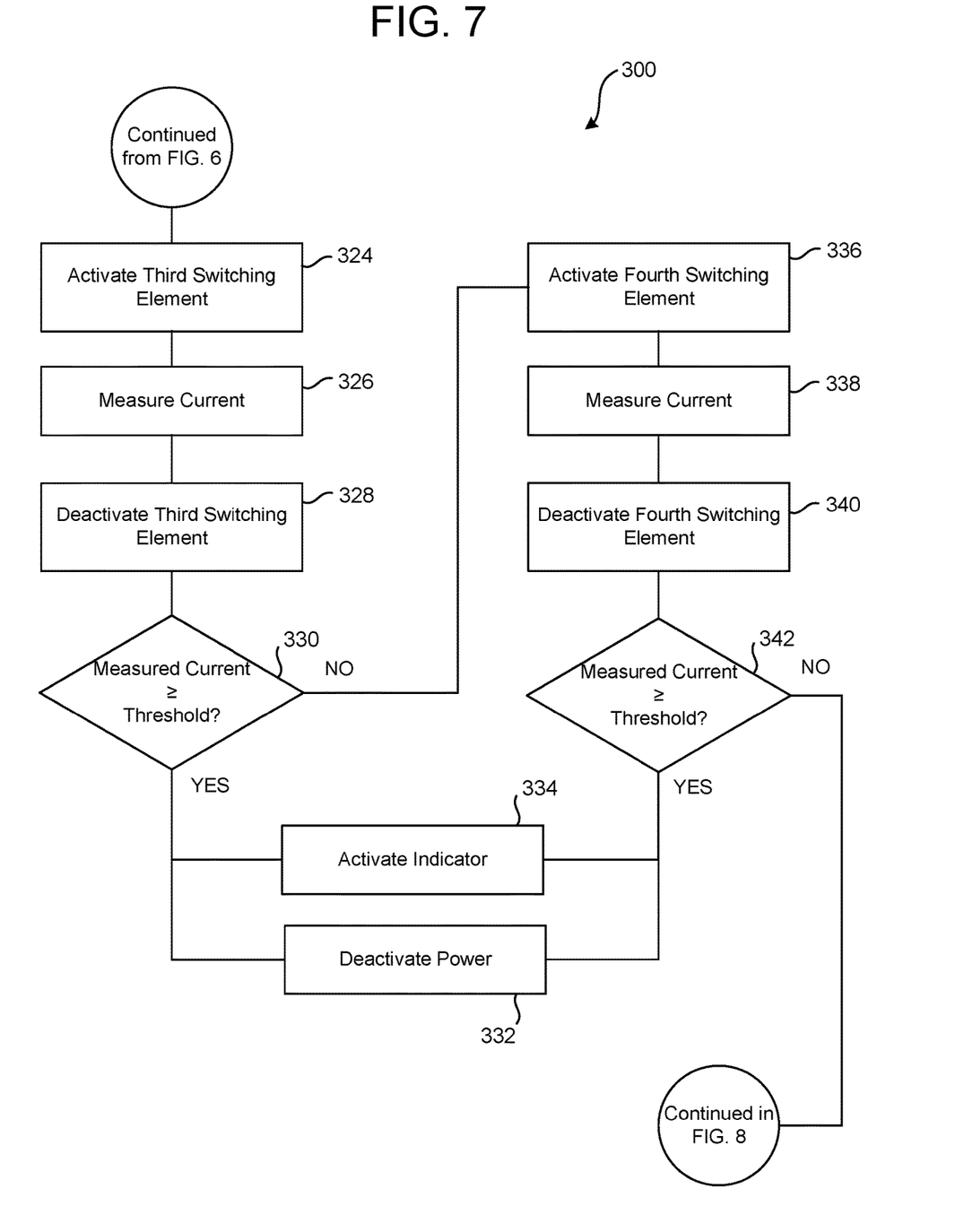
Figure 8:
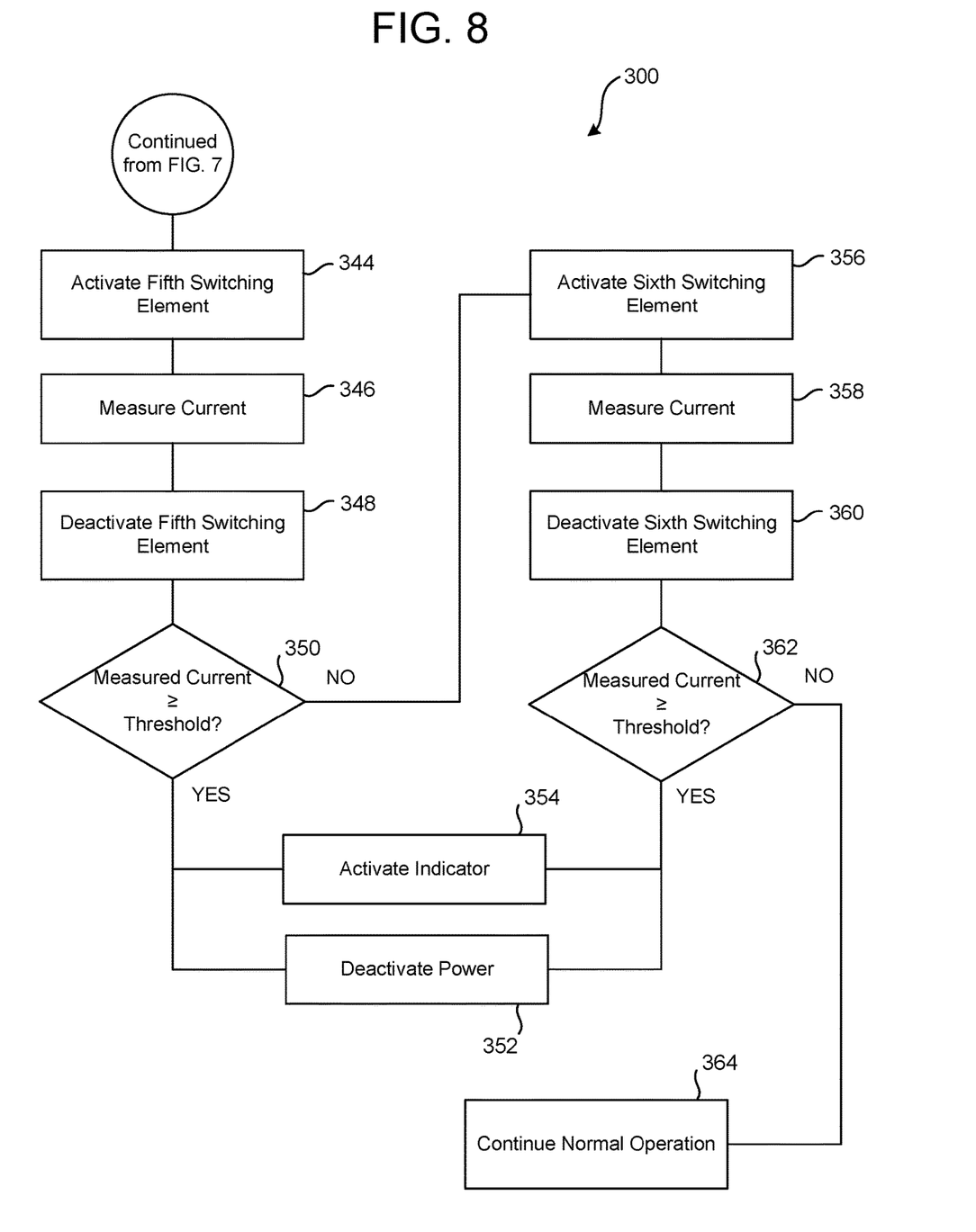

Referring to FIGS. 6-8, another method 300 of performing a switching element short circuit check is described. The method 300 may be performed before, after, or substantially at the same time as the method 200. In an example, the method 300 is performed after the method 200. The controller 116 is powered up and/or the trigger 110 is actuated, illustrated as block 302. The controller 116 activates or turns ON a first switching element (such as $H_1$), illustrated as block 304, for a period of time (such as 1-5 microseconds, for example). The controller 116 measures the current flowing through the half-bridge or the full power stage of the first switching element, illustrated as block 306, and deactivates or turns OFF the first switching element (such as $H_1$), illustrated as block 308. The controller 116 determines whether the measured current is greater than or equal to a second threshold (such as 5 A, for example), illustrated as block 310. When the measured current is greater than or equal to the second threshold, the controller 116 deactivates power to the controller 116, illustrated as block 312, and indicates a fault condition, for example, by activating the indicator 122, illustrated as block 314. However, when the measured current is less than the second threshold, the controller 116 continues the process and checks the next switching element. The controller 116 may also continue the process and check the next switching element even if a short circuit is detected. The controller 116 may also deactivate the indicator 122 after a predetermined period of time, to conserve power.

The controller 116 activates or turns ON a second switching element (such as $L_1$), illustrated as block 316, for a period of time (such as 1-5 microseconds, for example). The controller 116 measures the current flowing through the half-bridge or the full power stage of the second switching element, illustrated as block 318, and deactivates or turns OFF the second switching element (such as $L_1$), illustrated as block 320. The controller 116 determines whether the measured current is greater than or equal to the second threshold, illustrated as block 322. When the measured current is greater than or equal to the second threshold, the controller 116 deactivates power to the controller 116, illustrated as block 312, and indicates a fault condition, for example, by activating the indicator 122, illustrated as block 314. When the measured current is less than the second threshold, the controller 116 continues the process and check the next switching element. The controller 116 may also continue the process and check the next switching element even if a short circuit is detected. The controller 116 may also deactivate the indicator 122 after a predetermined period of time, to conserve power.

The controller 116 activates or turns ON a third switching element (such as $H_2$), illustrated as block 324, for a period of time (such as 1-5 microseconds, for example). The controller 116 measures the current flowing through the half-bridge or the full power stage of the third switching element, illustrated as block 326, and deactivates or turns OFF the third switching element (such as $H_2$), illustrated as block 328. The controller 116 determines whether the measured current is greater than or equal to the second threshold, illustrated as block 330. When the measured current is greater than or equal to the second threshold, the controller 116 deactivates power to the controller 116, illustrated as block 332, and indicates a fault condition, for example, by activating the indicator 122, illustrated as block 334. When the measured current is less than the second threshold, the controller 116 continues the process and check the next switching element. The controller 116 may also continue the process and check the next switching element even if a short circuit is detected. The controller 116 may also deactivate the indicator 122 after a predetermined period of time, to conserve power.

The controller 116 activates or turns ON a fourth switching element (such as $L_2$), illustrated as block 336, for a period of time (such as 1-5 microseconds, for example). The controller 116 measures the current flowing through the half-bridge or the full power stage of the fourth switching element, illustrated as block 338, and deactivates or turns OFF the fourth switching element (such as $L_2$), illustrated as block 340. The controller 116 determines whether the measured current is greater than or equal to the second threshold, illustrated as block 342. When the measured current is greater than or equal to the second threshold, the controller 116 deactivates power to the controller 116, illustrated as block 332, and indicates a fault condition, for example, by activating the indicator 122, illustrated as block 334. When the measured current is less than the second threshold, the controller 116 continues the process and check the next switching element. The controller 116 may also continue the process and check the next switching element even if a short circuit is detected. The controller 116 may also deactivate the indicator 122 after a predetermined period of time, to conserve power.

The controller 116 activates or turns ON a fifth switching element (such as $H_3$), illustrated as block 344, for a period of time (such as 1-5 microseconds, for example). The controller 116 measures the current flowing through the half-bridge or the full power stage of the fifth switching element, illustrated as block 346, and deactivates or turns OFF the fifth switching element (such as $H_3$), illustrated as block 348. The controller 116 determines whether the measured current is greater than or equal to the second threshold, illustrated as block 350. When the measured current is greater than or equal to the second threshold, the controller 116 deactivates power to the controller 116, illustrated as block 352, and indicates a fault condition, for example, by activating the indicator 122, illustrated as block 354. When the measured current is less than the second threshold, the controller 116 continues the process and check the next switching element. The controller 116 may also continue the process and check the next switching element even if a short circuit is detected. The controller 116 may also deactivate the indicator 122 after a predetermined period of time, to conserve power.

The controller 116 activates or turns ON a sixth switching element (such as $L_3$), illustrated as block 356, for a period of time (such as 1-5 microseconds, for example). The controller 116 measures the current flowing through the half-bridge or the full power stage of the sixth switching element, illustrated as block 358, and deactivates or turns OFF the sixth switching element (such as $L_3$), illustrated as block 360. The controller 116 determines whether the measured current is greater than or equal to the second threshold, illustrated as block 362. When the measured current is greater than or equal to the second threshold, the controller 116 deactivates power to the controller 116, illustrated as block 352, and indicates a fault condition, for example, by activating the indicator 122, illustrated as block 354. When the measured current is less than the second threshold, no fault is detected, and the controller 116 proceeds with normal operation of the tool 100, illustrated as block 364. The controller 116 may also continue the process and check the next switching element even if a short circuit is detected. The controller 116 may also deactivate the indicator 122 after a predetermined period of time, to conserve power.

It should be appreciated that the switching elements ($L_1$, $L_2$, $L_3$, $H_1$, $H_2$, and $H_3$) can be individually checked in any order via the method 300. By testing each switching element individually, the controller 116 is able to determine whether the shorted switching element is the opposite one in the half-bridge being tested. For example, if a high-side switching element ($H_1$) is turned ON and the current is greater than or equal to the second threshold (such as 5 A, for example), the low-side switching element ($L_1$) in that half-bridge has a short circuit. This two-step switching element short circuit detection may be performed every time the controller 116 powers up (as an initial diagnostics check), and every time the trigger 110 is actuated, so that a short circuit is not introduced or re-introduced into the controller circuit. This reduces the risk of damage to the controller 116, power source 120, and other components of the tool 100 due to a short circuit event.

As discussed herein, the tool 100 is a ratchet-type wrench. However, the tool 100 can be any type of hand-held motorized tool, including, without limitation, electrically powered or motorized tools, such as a drill, router, or impact wrench, ratchet wrench, screwdriver, or other powered tool, that is powered by electricity via an external power source (such as a wall outlet and/or generator outlet) or a battery. Moreover, it will be appreciated that the present invention is not limited to use with power tools, but can be used with any device that uses a BLDC motor.

As used herein, the term "coupled" and its functional equivalents are not intended to necessarily be limited to direct, mechanical coupling of two or more components. Instead, the term "coupled" and its functional equivalents are intended to mean any direct or indirect mechanical, electrical, or chemical connection between two or more objects, features, work pieces, and/or environmental matter. "Coupled" is also intended to mean, in some examples, one object being integral with another object. As used herein, the term "a" or "one" may include one or more items unless specifically stated otherwise.

The matter set forth in the foregoing description and accompanying drawings is offered by way of illustration only and not as a limitation. While particular embodiments have been shown and described, it will be apparent to those skilled in the art that changes and modifications may be made without departing from the broader aspects of the inventors' contribution. The actual scope of the protection sought is intended to be defined in the following claims when viewed in their proper perspective based on the prior art.

What is claimed is:

1. A tool having a motor, a power source adapted to supply power to the motor, and switching elements, the tool comprising:
   a controller adapted to:
      individually activate and deactivate the switching elements;
      measure a first current corresponding to at least one of the switching elements when activated; and
      indicate a short circuit fault has occurred in at least one of the switching elements when the measured first current meets or exceeds a first threshold current.

2. The tool of claim 1, wherein the controller is adapted to individually activate and deactivate the switching elements, and measure the first current by:
   activating a first switching element of the switching elements;
   measuring the first current, wherein the first current corresponds to the first switching element; and
   deactivating the first switching element.

3. The tool of claim 1, further comprising an indicator, wherein the controller is adapted to indicate the short circuit fault by activating the indicator.

4. The tool of claim 1, wherein the controller is further adapted to deactivate the supply of power to the motor when the measured first current meets or exceeds the first threshold current.

5. The tool of claim 1, wherein the controller is further adapted to perform a bootstrap capacitor charging process by simultaneously or individually activating low-side switching elements of the switching elements.

6. The tool of claim 5, wherein the controller is further adapted to:
   measure a second current corresponding to at least one of the low-side switching elements; and
   indicate a fault when the measured second current meets or exceeds a second threshold current.

7. The tool of claim 6, further comprising an indicator, wherein the controller is adapted to indicate the fault by activating the indicator.

8. The tool of claim 6, wherein the controller is further adapted to deactivate the supply of power to the motor when the measured second current meets or exceeds the second threshold current.

9. A method for operating a brushless DC motor having switching elements and being powered by a power supply, the method comprising:
   individually activating and deactivating the switching elements;
   measuring a first current corresponding to at least one of the switching elements when activated; and
   indicating a short circuit fault has occurred in at least one of the switching elements when the measured first current meets or exceeds a first threshold current.

10. The method of claim 9, wherein individually activating and deactivating the switching elements, and measuring the first current includes:
    activating a first switching element of the switching elements;
    measuring the first current, wherein the first current corresponds to the first switching element; and
    deactivating the first switching element.

11. The method of claim 10, further comprising:
    activating a second switching element of the switching elements;
    measuring a second current, wherein the second current corresponds to the second switching element;
    deactivating the second switching element; and
    indicating a short circuit fault when the measured second current meets or exceeds the first threshold current.

12. The method of claim 9, wherein indicating the short circuit fault includes activating an indicator.

13. The method of claim 9, further comprising deactivating the supply of power to the motor when the measured first current meets or exceeds the first threshold current.

14. The method of claim 9, further comprising performing a bootstrap capacitor charging process by simultaneously or individually activating low-side switching elements of the switching elements.

15. The method of claim 14, further comprising:
    measuring a second current corresponding to at least one of the low-side switching elements; and
    indicating a fault when the measured second current meets or exceeds a second threshold current.

16. The method of claim 15, wherein indicating the fault includes activating an indicator.

17. The method of claim 15, further comprising deactivating the supply of power to the motor when the measured second current meets or exceeds the second threshold current.

18. A controller for controlling a brushless DC motor including switching elements, the controller comprising:
    a processing unit adapted to:
       perform a first short circuit check including:
          activating a first switching element of the switching elements;
          measuring a first current corresponding to the first switching element;
          deactivating the first switching element;
          indicating a first fault has occurred in one of the switching elements when the measured first current meets or exceeds a first threshold current;
          activating a second switching element of the switching elements when the measured first current is less than the first threshold current;
          measuring a second current corresponding to the second switching element;
          deactivating the second switching element; and
          indicating a second fault has occurred when the measured second current meets or exceeds the first threshold current.

19. The controller of claim 18, wherein indicating the first or second fault has occurred includes activating an indicator.

20. The controller of claim 18, wherein the processing unit is further adapted to deactivate a supply of power to the motor when the measured first current meets or exceeds the first threshold current.

21. The controller of claim 18, wherein the processing unit is further adapted to perform a second short circuit check during a bootstrap capacitor charging process, the second short circuit check including:
    simultaneously or individually activating low-side switching elements of the switching elements;
    measuring a third current corresponding to at least one of the low-side switching elements; and indicating a third fault when the measured third current meets or exceeds a second threshold current.

22. The controller of claim 21, wherein the processing unit is further adapted to deactivate a supply of power to the motor when the measured third current meets or exceeds the second threshold current.

* * * * *